United States Patent [19]

Kodai et al.

[11] Patent Number: 5,079,673
[45] Date of Patent: Jan. 7, 1992

[54] IC CARD MODULE

[75] Inventors: Syojiro Kodai; Katsunori Ochi, both of Itami; Fumiaki Baba, Amagasaki, all of Japan

[73] Assignee: Mitsubishi Denki Kabushiki Kaisha, Japan

[21] Appl. No.: 620,392

[22] Filed: Nov. 30, 1990

Related U.S. Application Data

[63] Continuation of Ser. No. 370,041, Jun. 22, 1989, abandoned.

[30] Foreign Application Priority Data

Apr. 6, 1989 [JP] Japan ................................. 1-85761

[51] Int. Cl.[5] ................................................ H05K 7/02
[52] U.S. Cl. ..................................... 361/400; 174/52.2; 235/492; 235/488
[58] Field of Search .................... 174/52.2, 52.3, 52.4; 235/488, 492-493; 361/392, 394, 395, 397, 398, 400-402, 404-406, 414

[56] References Cited

U.S. PATENT DOCUMENTS

| | | | |
|---|---|---|---|
| 4,719,140 | 1/1988 | Hara et al. | 235/488 |
| 4,727,246 | 2/1988 | Hara et al. | 361/401 |
| 4,737,620 | 4/1988 | Mollet et al. | 235/488 |
| 4,746,392 | 5/1988 | Hoppe | 361/402 |
| 4,789,347 | 12/1988 | Banjo et al. | 439/140 |
| 4,795,895 | 1/1989 | Hara et al. | 235/488 |
| 4,879,153 | 11/1989 | Ohashi et al. | 428/76 |

FOREIGN PATENT DOCUMENTS

| | | |
|---|---|---|
| 0277854 | 8/1988 | European Pat. Off. |
| 3248385 | 6/1984 | Fed. Rep. of Germany |
| 57-79652 | 5/1982 | Japan |
| 60-189940 | 9/1985 | Japan |
| 61-19154 | 1/1986 | Japan |
| 61-113241 | 5/1986 | Japan |

*Primary Examiner*—Gregory D. Thompson
*Attorney, Agent, or Firm*—Leydig, Voit & Mayer

[57] ABSTRACT

An IC card module includes a substrate one side of which is provided with a connection terminal; and a resin-sealed semiconductor IC which has been previously sealed by a resin. This connection terminal and the resin-sealed semiconductor IC are electrically connected to each other and are covered with a molding resin. Accordingly, reliable modules can be efficiently manufactured and readily mounted on IC card substrates.

6 Claims, 2 Drawing Sheets

FIG. I
PRIOR ART
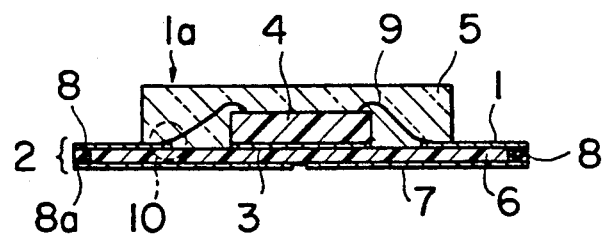
FIG. 2
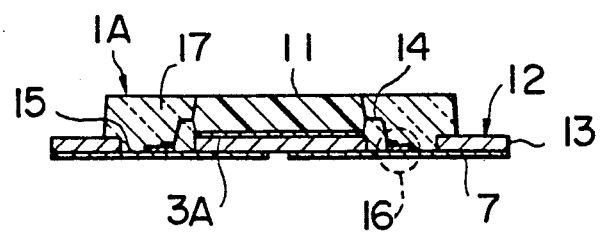
FIG. 3
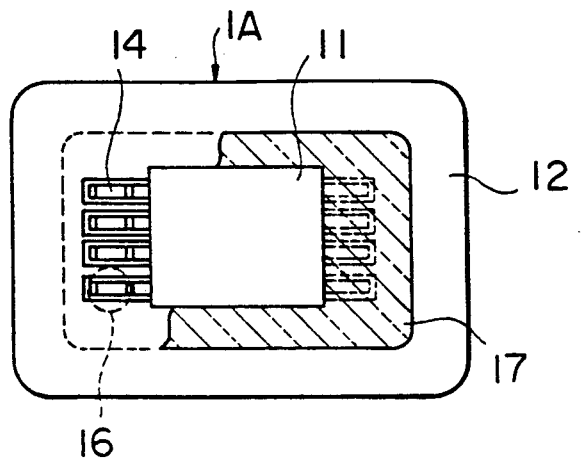

IC CARD MODULE

This application is a continuation of application Ser. No. 07/370,041, filed June 22, 1989, now abandoned.

BACKGROUND OF THE INVENTION

1. FIELD OF THE INVENTION

The present invention relates to an IC card module, and, more particularly, to an IC module (abbreviated to "module" hereinafter) designed to be mounted on thin semiconductor devices such as IC cards.

2. DESCRIPTION OF THE RELATED ART

FIG. 1 is a side elevational cross-sectional view which illustrates a conventional module to be mounted on a thin semiconductor device such as an IC card. Module 1a includes: a circuit substrate 2 on which a circuit 1 is formed; an IC chip 4 secured to the surface of the circuit substrate 2 by means of a die bonding material 3; and sealing resin 5 for sealing both the IC chip 4 and the portion around the IC chip 4.

Furthermore, the conventional IC card module 1a is structured in such a manner that a connecting terminal 7 is provided on the reverse side of a substrate core 6 of the circuit substrate 2, this connecting terminal 7 being electrically connected to the circuit 1 disposed on the obverse side of the substrate core 6 via a conductor 8 enclosed in a through hole 8a. The IC chip 4 and the circuit 1 disposed on the surface of the circuit substrate 2 are connected to each other by a metallic wire 9 or the like whereby a connection portion 10 is formed, and a portion in the vicinity of the IC chip 4 including this connection portion 10 is sealed by a sealing resin 5 such as epoxy resin.

The circuit substrate 2 of the IC card module 1a cannot be subjected to relatively high temperatures since the same comprises, for example, a glass epoxy printed circuit substrate. Thus, the types of material that can be used as the die bonding material 3 for die-bonding the IC chip 4 are limited. In addition, the conditions for wire-bonding the circuit 1 on the circuit substrate 2 to the IC chip 4 using a metallic wire or the like are also limited. Furthermore, since the IC chip 4 is not packed with a resin, the module 1a before being resin sealed need to be manufactured in clean rooms or the like. This leads to the fact that the yields obtainable in manufacturing the module 1a are low and that the final products lack satisfactory reliability. In addition, the work of sealing IC chip 4 with resin raises a problem of poor working efficiency and dimensional stability due to the fact that the sealing with resin is performed by potting. If this resin-sealing work is performed by mold sealing, the work encounters another problem in that the dimensional accuracy between the circuit substrate 2 and a mold is insufficient if serial molding of the circuit substrate is performed. The poor dimensional accuracy results from the difference in thermal expansion coefficient between the substrate 2 and the mold which is caused by the influence of the substrate core 6 of the circuit substrate 2.

On the other hand, as prescribed in JIS-X6303, when the module 1a is to be embedded in or mounted on a base body (omitted from illustration) of the IC card, it is embedded in or mounted on a base body in the form of a laminated card made of a rigid polyvinyl chloride sheet. The module 1a therefore needs to be designed in a simple shape so as to be readily embedded in or mounted on a sheet of the type described above.

Hitherto, when resin-packed ICs are directly embedded in IC cards and are connected to the terminal portions of the IC cards, a problem arises in that connection pins in the ICs can be broken. An undulation can be created over the surfaces of the reverse sides of the IC cards since a plurality of card base bodies are laminated on each other before being pressurized. In order to overcome the above-described problems, additional work needs to be performed to create a recessed portion at a position of the card base body corresponding to a connection pin, or alternatively a connection pin is inserted into the card base body. As described above, when resin-packed ICs and the terminal portions of the IC cards are connected, the shape of the connection portion, in particular the shape of the portion in the vicinity of the pins of the resin-packed ICs' becomes too complicated. This causes a problem in that it is difficult for the resin packed IC in the form of a module to be embedded in or mounted on the IC card base body.

SUMMARY OF THE INVENTION

An object of the present invention is to provide a module which is able to overcome the above-described problems of manufacture of modules and of mounting on IC card base bodies, and which can be effectively manufactured and shows an improved reliability.

In order to achieve the above object, according to an aspect of the present invention, there is provided an IC card module comprising: a substrate one side of which is provided with a connection terminal; a resin-sealed semiconductor IC held on the other side of the substrate and electrically connected to the connection terminal; and a molding resin for covering at least the electrically-connected portion between the connection terminal and the resin-sealed semiconductor IC and for integrally molding the substrate and the resin-sealed semiconductor IC.

According to the present invention, a completed resin-packed IC is, after its quality has been confirmed, mounted on a substrate and is then further resin-molded for the purpose of shaping the contour as the completed module. Therefore, since the resin, to be twice molded is prevented from being brought into contact directly with the IC chip, widely used resins that can produce an improved manufacturing yield can be selected. In addition, the thus-selected resin can form various shaped IC card modules by using the same resin-packed ICs.

BRIEF DESCRIPTION OF THE DRAWINGS

FIG. 1 is a side elevational cross-sectional view which illustrates a conventional IC card module;

FIG. 2 is a side elevational view which illustrates an embodiment of an IC card module according to the present invention;

FIG. 3 is a plan view which illustrates the module shown in FIG. 2, from which a portion is broken away.

DESCRIPTION OF THE PREFERRED EMBODIMENTS

Figure 4:
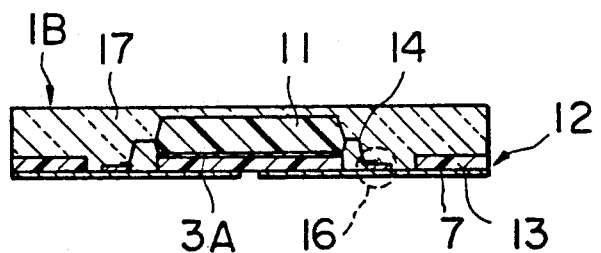
FIGS. 4 to 6 are side elevational, cross-sectional views each of which illustrates and additional embodiment of an IC card module according to the present invention.

FIG. 2 is a side elevational cross-sectional view which illustrates an embodiment of an IC card module 1A according to the present invention, and FIG. 3 is a plan view, from which a portion is broken away, illustrating the module 1A shown in FIG. 2. The module 1A according to the present invention comprises a resin-sealed semiconductor IC such as resin-packed IC 11. The resin-sealed semiconductor IC 11 is formed in such a manner that an IC chip thereof is previously sealed with a molding resin such as epoxy resin or the like. This resin packed IC 11 is, at the resin portion thereof, adhered to a predetermined position in an insulating body 13 that is part of a substrate, such as a terminal substrate 12, with an adhesive 3A made of epoxy resin or the like. As an alternative to the manner in which the adhesive 3A is used, the resin-packed IC 11 may be temporarily held. The terminal substrate 12 comprises a so-called single-sided substrate in which a connection terminal 7 is provided on one side thereof. The insulating body 13 portion of substrate 12 is opened at a portion in which a connection pin 14 of the resin-packed IC 11 is connected to a connection terminal 7 of the terminal substrate 12. The connection pin 14 of the resin-packed IC circuit 11 is electrically, mechanically, and directly connected to the reverse side of the connection terminal 7 via an opening in the insulating body 13 by soldering whereby a connection portion 16 is formed. Then, the terminal substrate 12 and the resin-packed IC 11 mounted on the former are set in a mold (omitted from illustration) so that, as shown in FIG. 2, they are integrally formed with at least the connection pin 14 and the connection portion 16 covered by a molding resin 17. In this case shown in FIG. 2, the terminal substrate 12 on which the resin-packed IC 11 is mounted is held between and secured to a mold having a cavity in which the resin-packed IC 11 can be covered with the molding resin 17. Then, this molding resin 17, such as thermotropic liquid crystal polymer ("VECTRA C-130" manufactured by Poly Plastics Co., Ltd.) which is a thermoplastic resin is injected in the portion of the mold that is circumferential to the resin-packed IC 11 to encapsulate the former components. As a result, a desired module is manufactured. Since this thermotropic liquid crystal polymer exhibits a high elastic modulus and a low coefficient of thermal expansion, it can be readily introduced into narrow gaps. If molding with the molding resin 17 is performed, for example, if thermoplastic resin is injection-molded, its cycle can be completed within substantially 20 seconds, so that the manufacturing yield can be significantly improved in comparison to the conventional molding with epoxy resin which takes minutes to complete.

Figure 5:
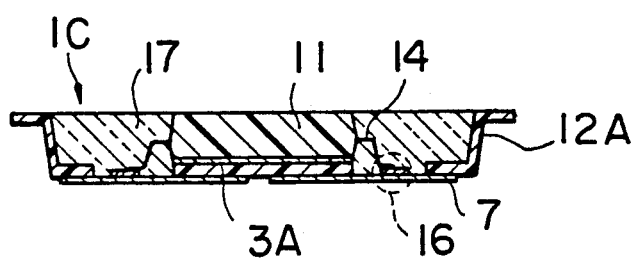
Figure 6:
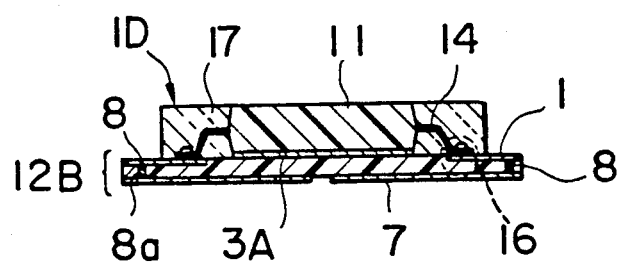

FIGS. 4 to 6 are side elevational cross-sectional views each of which illustrates an additional embodiment of a module according to the present invention. A module 1B shown in FIG. 4 is arranged in such a manner that the resin-packed IC 11 and the insulating body 13 of substrate 12 are completely encapsulated by the molding resin 17. A module IC shown in FIG. 5 is obtained by performing molding, with a dish-like terminal substrate 12A. The resin-packed IC 11 is fitted within the recessed portion of this terminal substrate 12A. A module 1D shown in FIG. 6 is obtained by: mounting the resin-packed IC 11 on a so-called single-sided substrate 12B provided with the connection terminal 7 on the reverse side thereof and provided with the circuit 1 on the obverse side thereof; and molding them, similarly to the case shown in FIG. 2, with the molding resin 17. The connecting terminal 7 is electrically connected to the circuit 1 via a conductor 8 enclosed in a through hole 8a.

The above-described IC card modules use thin resin-packed ICs 11 manufactured by a mass-production process in a usual shape and the quality of which has been previously confirmed. Therefore, no operation needs to be performed in a clean room such as that needed at the time of manufacturing the conventional modules in which the IC chips are used intact. As a result the manufacturing yield is improved, and manufacturing cost is reduced. Furthermore, the reliability of the ICs can be maintained. The resin-packed IC 11 is mounted on the individual substrate, and they are integrally molded in such a manner that the electrical connection therebetween can be efficiently established and a predetermined simple shape can be realized. Therefore, when the thus-manufactured module is mounted on or embedded in the IC card base body, this module and the IC card base body can be readily coupled. As a result, reliable IC cards can be efficiently provided. Furthermore, the above-described additional work performed for the purpose of preventing the breakage of the connection pin of the IC or the creation of undulations on the surface of the IC card is needless. Therefore, the resin-packed IC can be readily mounted on or embedded in the IC card.

Although thermotropic liquid crystal polymer which is a thermoplastic resin is used as the molding resin 17 in the above-described embodiments, the other thermoplastic resins, such as polybuthyleneterephtalate, polyphenylenesulfide, polycarbonate and ABS resin can be used, and thermosetting resin can also be used, with which the similar effects obtained by the above-described embodiments can be obtained.

What is claimed is:

1. An IC card module comprising:
   a substrate having opposed first and second sides, said substrate including (i) an electrical connection terminal disposed only at and forming the first side of said substrate and (ii) an insulating body disposed at and forming the second side of the substrate, said insulating body including at least one opening therethrough providing access to said electrical connection terminal from the second side at the opening;
   a semiconductor IC encapsulated by a first molding resin and having at least one connection pin extending from said first molding resin, said semiconductor IC being mounted on said insulating body with said connection pin electrically connected at the opening to said connection terminal forming a first electrical connection; and
   a second molding resin:
   (i) encapsulating at least said connection pin and said first electrical connection;
   (ii) covering at least part of said insulating body; and
   (iii) encapsulating said semiconductor IC encapsulated by said first molding resin.

2. An IC card module according to claim 1 wherein said substrate comprises a dish-like terminal substrate having a recess, and said semiconductor IC encapsulated by the first molding resin is disposed in and encapsulated with said second molding resin in said recess.

3. An IC card module according to claim 1 wherein said second molding resin comprises a thermoplastic resin.

4. An IC card module according to claim 3 wherein said thermoplastic resin comprises at least one selected from the group consisting of polybuthyleneterephtalate, polyphenylenesulfide, polycarbonate, and ABS resin.

5. An IC card module according to claim 3 wherein said thermoplastic resin comprises a thermotropic liquid crystal polymer.

6. An IC card module according to claim 1 wherein said second molding resin comprises a thermosetting resin.

* * * * *